US009261036B2

(12) United States Patent
Nieddu et al.

(10) Patent No.: US 9,261,036 B2
(45) Date of Patent: Feb. 16, 2016

(54) METHOD TO MINIMIZE COMMON RAIL PRESSURE IRREGULARITIES DUE TO ALIASING EFFECT ON BATTERY VOLTAGE MONITORING

(75) Inventors: Stefano Nieddu, Turin (IT); Maura Dintino, Turin (IT)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 829 days.

(21) Appl. No.: 13/429,790

(22) Filed: Mar. 26, 2012

(65) Prior Publication Data

US 2012/0253720 A1 Oct. 4, 2012

(30) Foreign Application Priority Data

Mar. 29, 2011 (GB) .................................. 1105267.7

(51) Int. Cl.

| | |
|---|---|
| ***G01R 23/00*** | (2006.01) |
| ***F02D 41/14*** | (2006.01) |
| ***F02D 41/38*** | (2006.01) |
| *G06F 11/30* | (2006.01) |

(52) U.S. Cl.

CPC ........ *F02D 41/1401* (2013.01); *F02D 41/3845* (2013.01); *F02D 2041/141* (2013.01); *F02D 2041/1409* (2013.01); *F02D 2041/1432* (2013.01); *F02D 2200/0602* (2013.01); *F02D 2200/101* (2013.01); *F02D 2200/503* (2013.01); *F02D 2250/31* (2013.01)

(58) Field of Classification Search

CPC . F02D 41/3845; F02D 41/20; F02D 41/3809; F02D 41/3836; F02D 41/3827; F02D 41/30; F02D 2041/2027; F02D 2041/2015; F02D 2250/31; F02D 2250/04; F02D 2200/503; F02D 1/00; F02D 1/04; F02D 2001/0085; F02D 19/0605

USPC .................................. 123/456–458; 701/103

See application file for complete search history.

(56) References Cited

U.S. PATENT DOCUMENTS

| | | | | |
|---|---|---|---|---|
| 6,367,452 B1 * | 4/2002 | Shima et al. | .................. | 123/457 |
| 2005/0051137 A1 * | 3/2005 | Doelker | ........................ | 123/458 |

(Continued)

OTHER PUBLICATIONS

"Aliasing and Sampling at Frequencies Above the Nyquist Frequency", Dec. 13, 2006, National Instruments, http://www.ni.com/white-paper/3000/en/.* We Li et al., "Introduction to phase-locked loop system modeling", May 2000, Texas Instruments Incorporated, Analog Applications Journal SLYT015, p. 5-10.*

(Continued)

*Primary Examiner* — Phuong Huynh

(74) *Attorney, Agent, or Firm* — Ingrassia Fisher & Lorenz PC

(57) ABSTRACT

A method to minimize common rail pressure irregularities due to aliasing effect on battery voltage monitoring in a digital electronic control unit that is capable of PWM (Pulse Width Modulation) regulations of a metering valve unit in a diesel common-rail power-train system. At least an engine rotary speed signal is detected and at least a battery voltage signal is monitored, the method includes, but is not limited to calculating the aliasing frequency on said battery voltage signal as a function of said engine rotary speed signal, filtering the battery voltage signal before it is input to said controller module with at least one digital non-linear notch filter, the at least one digital non-linear notch filter centered about the first harmonic of the aliasing frequency, and input the filtered battery voltage signal, at least with the engine rotary speed signal, to the controller module for PWM regulating the metering valve unit.

19 Claims, 4 Drawing Sheets

(56) References Cited

U.S. PATENT DOCUMENTS

| | | | | |
|---|---|---|---|---|
| 2006/0130813 | A1* | 6/2006 | Dolker | 123/458 |
| 2009/0192969 | A1 | 7/2009 | Arthursson et al. | |
| 2009/0223488 | A1* | 9/2009 | Dolker | 123/456 |
| 2010/0122691 | A1* | 5/2010 | Xiao et al. | 123/490 |
| 2012/0143464 | A1* | 6/2012 | Kim | 701/102 |
| 2012/0221226 | A1* | 8/2012 | Dolker | 701/103 |

OTHER PUBLICATIONS

Karuppanan P et al., "PLL with PI, PID, and Fuzzy Logic Controllers based Shunt Active Power Line Conditioners", Dec. 2010, IEEE Pedes.*

Karimi-Ghartemani et al., "A Nonlinear Adaptive Filter for Online Signal Analysis in Power Systems: Applications" Apr. 2002, IEEE Transactions on Power Delivery, vol. 17, No. 2, p. 617-622.*

* cited by examiner

METHOD TO MINIMIZE COMMON RAIL PRESSURE IRREGULARITIES DUE TO ALIASING EFFECT ON BATTERY VOLTAGE MONITORING

CROSS-REFERENCE TO RELATED APPLICATION

This application claims priority to British Patent Application No. 1105267.7 filed Mar. 29, 2011, which is incorporated herein by reference in its entirety.

TECHNICAL FIELD

The technical field relates to a method to minimize common rail pressure irregularities due to aliasing effect on battery voltage monitoring in a digital (electronic) control unit that is able to carry out a PWM regulation of a metering valve unit in a common-rail diesel power-train system.

BACKGROUND

In a diesel common rail power-train system, as the one sketched in FIG. 1, great importance has the fuel pressure run in the common rail placed upstream to the engine injectors, in order to assure efficiency and regularity of the engine operation. Such a fuel pressure within the rail is usually controlled by means of an electronic digital control unit that regulates, usually with a digital PWM (Pulse Width Modulation) technique, the metering valve unit controlling the fuel intake in the high pressure pump feeding the rail. The electronic control unit generally receives as inputs at least the monitored (digitized) battery voltage signal and the engine rotary speed signal, properly acquired with known detectors, and provides as output a PWM signal, with a required duty-cycle.

But, as known in the art, in a diesel common-rail power-train system, the battery voltage signal, that for generic purposes might be considered quite flat, is indeed affected by voltage drops and noises that cannot be disregarded when a PWM regulation of a high sensitivity load, such as the metering valve unit, is carried out by an electronic (digital) control unit. In fact, a common-rail power-train system usually comprises a digital control unit for driving a number of actuators, on the basis of digital signals coming from a number of relevant detectors, as well as on the basis of the monitored battery voltage signal. Among the actuators, as already mentioned, the metering valve unit is usually regulated by means of a PWM (Pulse Width Modulation) technique, by a proper controller module.

In such an environment, it should be pointed out that driving of many actuators (e.g., the fuel injectors) in a diesel common-rail power-train system is generally synchronous with the engine position (i.e., with the engine rotary speed) and thus it introduces a generally periodic effect on the battery voltage signal. More in detail, such a generally periodic effect on the battery voltage signal can be described as follows.

The battery voltage drops with conducted and irradiated noise through the electrical circuit of the power-train system generate a periodic ripple that superimposes the voltage mean value of the battery voltage signal, and the first harmonic frequency of the battery voltage signal, which is defined by its mean value plus the periodic ripple, is directly linked to the engine rotary speed.

Aliasing in battery voltage monitoring can thus affect the regulation of the metering valve unit by an electronic control unit, when sampling frequency matches the battery voltage signal harmonic spectrum, thus resulting in possible unduly pressure irregularities (oscillations) within the diesel common rail. In particular, considering a sampling time $t_s$ (e.g., 12.5 ms), since the afore-said periodic ripple superimposed on the battery voltage mean value can be considered to be a sub-multiple of the engine cycle period, digitalization of the battery voltage will result in a voltage signal substantially composed by the battery voltage mean value plus a low frequency component, having frequency equal to:

$$f_{aliasing} = \left| \frac{1}{t_s} - \frac{\text{rpm}}{k \cdot 60} \right|$$

Where:

rpm is the engine rotational speed expressed as revolutions per minute; –k is a constant depending on the cylinder number of the engine, defined as:

$$k = \frac{2}{\text{Cylinder number}}$$

(e.g., k is equal to 0.5 for a 4 cylinder engine and it is equal to 0.125 for a 16 cylinder engine).

This means that when $$t_s \cong \frac{k \cdot 60}{\text{rpm}},$$

an additional low frequency component will be generated by aliasing effect, so that the digitalized form of the battery voltage signal will be affected by an equivalent harmonic spectrum not corresponding to the actual battery voltage signal.

In a diesel common-rail power-train system, the regulation of the metering valve unit, which is that valve metering the fuel intake volume to the high-pressure pump of the common rail, may be strongly affected by said aliasing effect in the battery voltage signal, mainly due to the fact that the metering valve unit regulation is carried out by the actuation of a PWM (Pulse Width Modulation) voltage. In fact, as can be easily ascertained, the duty-cycle (D*) of the PWM regulation of the metering valve unit, may be seen as:

$$D^* = \frac{V^*_{MU}}{\hat{V}_{batt}}$$

Where $V^*_{MU}$ is the desired mean voltage across the metering valve unit and $\hat{V}_{batt}$ is the theoretical battery voltage (digital) signal.

Since the real battery voltage ($V_{batt}$) can be seen as the sum of the theoretical battery voltage signal $\hat{V}_{batt}$ with its voltage variation due to aliasing noise ($\Delta V_{aliasing}$), and the voltage effectively applied ($V_{MU}$) to the electromagnet of the metering valve unit results as the duty-cycle (D*) multiplied with the real battery voltage, one can easily ascertain that:

$$V_{MU} = D^* \cdot V_{batt} = V^*_{MU} \cdot \frac{V_{batt}}{V_{batt} - \Delta V_{aliasing}}$$

The mismatch between $V_{batt}$ and $\hat{V}_{batt}$ due to the possible aliasing effect will results in an undesired noise affecting the metering valve unit regulation.

Applying the "small signal approximation" one can see that the noise oscillation in the metering valve unit voltage ($\Delta V_{MU}$) can be so approximate:

$$\Delta V_{MU} = V_{MU} - V_{MU}^{*} = \frac{V_{MU}^{*}}{V_{batt}} \cdot \Delta V_{aliasing}$$

Such a noise oscillation ($\Delta V_{MU}$) thus affects the metering valve unit regulation with an entity that depends on the proper transfer function used by the relevant controller module in the Electronic Control Unit in order to transform the nominal (desired) fuel intake volume request (Q*) of the high-pressure pump, in a duty-cycle set point for regulating said metering valve unit.

Adopting again the small signal approximation, the close loop scheme reported in FIG. 2 can describe the PWM control unit of the metering valve unit in a diesel common-rail power-train system, affected by the aliasing effect on the battery voltage signal.

In FIG. 2, one can see that Q* is the desired fuel intake quantity request; I(Q): is the I-Q characteristic of the metering valve unit (i.e. the characteristic curve showing the relationship between current (I)—fuel quantity (Q) in the metering valve unit); $I^*_{MU}$: is the electrical current required to meet the fuel intake quantity request (Q*) using a metering valve unit with I(Q) characteristic; $\tilde{I}_{MU}$: is the nominal (theoretical) electrical current absorbed by the electromagnets of the metering valve unit; R(s): is the generic transfer function of the electronic control unit regulating the metering valve unit; $V^*_{MU}$: is the desired mean voltage across the electromagnet of the metering valve unit; $\Delta V_{MU}$: is the noise Oscillation in the metering valve unit voltage; and $V_{MU}$: is the voltage effectively applied to the electromagnet of the metering valve unit.

In view of above, it should be clear that the voltage oscillation effect can be focused as an equivalent fuel quantity oscillation according to the following equation:

$$\Delta Q_{aliasing} = Q\left(\frac{\Delta V_{MU}}{R(s)}\right)$$

This leads to the equivalent scheme of FIG. 3.

The applicant has ascertained that $\Delta Q_{aliasing}$ could reach values up to ~20÷40 $mm^3$/stroke, with the aliasing frequency of the battery voltage signal ranging from approximately 1 to 3 Hz, resulting in a pressure oscillation on the common rail with a peak to peak magnitude directly proportional to its capacity, up to 15÷30 MPa. Such an undesired pressure oscillation due to the aliasing effect on the battery voltage monitoring, results in certain unevenness in the engine operation when a certain rotational speed of the same engine is reached, with possible bad consequences on the efficiency of the engine, its fuel consumption and performances.

Therefore, at least object is to solve the drawbacks of the actual diesel common-rail power-train system underlined above, by removing, or at least reducing, the aliasing effect on the battery voltage monitoring in a digital control unit for PWM (Pulse Width Modulation) regulations of a metering valve unit in a diesel common-rail power-train system. It is thus at least another object to provide a method to minimize common rail pressure irregularities due to aliasing effect on battery voltage monitoring in a digital control unit for PWM (Pulse Width Modulation) regulations of a metering valve unit in a diesel common-rail power-train system. In addition, other objects, desirable features and characteristics will become apparent from the subsequent summary and detailed description, and the appended claims, taken in conjunction with the accompanying drawings and this background.

SUMMARY

A method is provided for rejecting aliasing effect on battery voltage monitoring in a digital electronic control unit that is capable of PWM (Pulse Width Modulation) regulations of a metering valve unit in a diesel common-rail power-train system. According to an embodiment, the method to minimize common rail pressure irregularities due to aliasing effect on battery voltage monitoring in a digital electronic control unit capable of PWM (Pulse Width Modulation) regulations of a metering valve unit in a diesel common-rail power-train system, where at least an engine rotary speed signal is detected and at least a battery voltage signal is input to a controller module in the electronic control unit for PWM regulating said metering valve unit, comprises the steps of: calculating the aliasing frequency on the battery voltage signal as a function of the engine rotary speed signal; filtering the battery voltage signal before it is input to said controller module, by means of at least one digital non-linear notch filter that is centered on the first harmonic of the aliasing frequency of the battery voltage signal; and input the filtered battery voltage signal, at least with the engine rotary speed signal, to said controller module of the electronic control unit for PWM regulating said metering valve unit.

Calculating the abasing frequency on the battery voltage signal as a function of the variable engine rotary speed signal, and thus dynamically filtering the battery voltage signal by means of a digital non-linear notch filter that is instant-by-instant centered on the first harmonic of said aliasing frequency of the battery voltage signal, leads to a significant reduction of the undesired aliasing effect of the battery voltage monitoring and therefore to a strong reduction, or rejection, of pressure oscillations in a diesel common-rail power-train system when a PWM regulation of the metering valve unit is carried out with a proper digital controller module.

According to an embodiment of the method, the step of filtering the battery voltage signal also comprises the step of providing a dynamic saturation to the output of the digital notch filter. The dynamic saturation forces the notch filter output to follow the battery voltage signal when the absolute value of the difference between the notch filter output Y and the battery voltage signal X exceeds a parameter $\Delta X_0$ that is set, after calibration, to be strictly higher than the battery voltage ripple magnitude responsible of the aliasing effect. Such a parameter $\Delta X_0$ is experimentally determined in order to make the filter properly following real strong battery voltage transients.

According to this embodiment, as it will be clear to the skilled person, the implementation in said digital non-linear notch filter of a dynamic saturation, with a proper choice of parameter $\Delta X_0$, prevents that the digital non-linear notch filter could introduce an improper time delay, when real large variations of the battery voltage signal occurs (e.g., during engine cranking phase).

According to a further embodiment, the controller module for PWM regulating the metering valve unit of a diesel common-rail power-train system has a main transfer function, for example a main transfer function of the PI (Proportional Integrative) type, and the method comprises the step of introducing an additional transfer function, in parallel to the main transfer function of the controller module, where the additional transfer function has at least the constraints of avoiding to reduce bandwidth and, at the same time, obtaining high gain at low frequency. Such a parallel transfer function without reduction of the bandwidth, but with a resultant high gain at low frequency, has the purpose of maximizing the rejection of additional noise on the battery voltage signal that is due to a possible mismatch between the real battery voltage and its monitored signal, as present downstream to the aforesaid digital non-linear notch filter.

According to another embodiment, a computer program is provided that includes, but is not limited to computer executable codes for PWM regulations of a metering valve unit in a diesel common-rail power-train system. According to this embodiment, a computer program comprising computer executable codes for PWM regulations of a metering valve unit in a diesel common-rail power-train system, where at least an engine rotary speed signal is detected and at least a battery voltage signal is monitored and input to a controller module for PWM regulating the metering valve unit, where the computer program is stored on a computer-readable medium or on a suitable storage unit, comprises: a computer executable code for calculating the aliasing frequency on said battery voltage signal as a function of the rotary speed signal; a computer executable code for implementing at least one digital non-linear notch filter, the at least one digital non-linear notch filter being centered on the first harmonic of the aliasing frequency; a computer executable code for filtering the battery voltage signal before it is input to the controller module with the at least one digital non-linear notch filter.

BRIEF DESCRIPTION OF THE DRAWINGS

The present invention will become fully understood from the following detailed description of an exemplary embodiment thereof, provided with reference to the accompanying drawings, purely by way of a non-limiting example, where.

DETAILED DESCRIPTION

The following detailed description is merely exemplary in nature and is not intended to limit application and uses. Furthermore, there is no intention to be bound by any theory presented in the preceding background or summary or the following detailed description.

Figure 1:
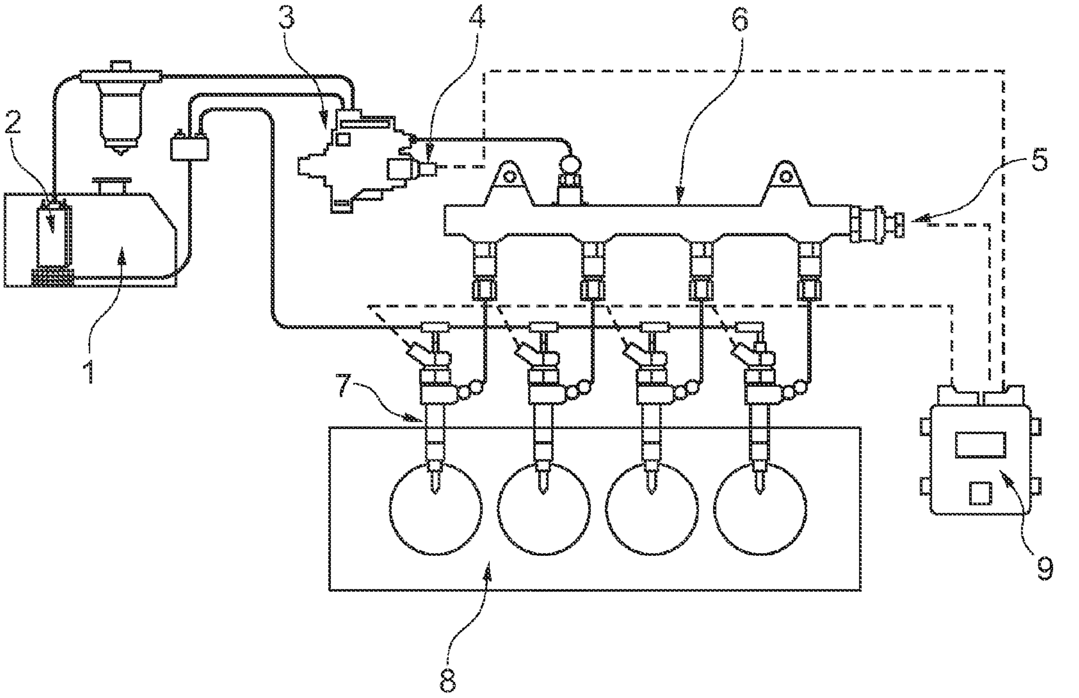
FIG. 1 is a schematic view of a common rail power-train system, to which embodiments of the present invention may apply.

With reference to FIG. 1, a general scheme of a diesel common-rail power-train system is shown. Such a power-train system comprises, as known in the art, a fuel tank 1 with a low pressure pump 2 feeding fuel to a high pressure pump 3. The power-train system depicted in FIG. 1 also comprises an Electronic (digital) Control Unit (ECU) 9 that regulates both the metering valve unit 4 and the injectors 7, on the basis of the common-rail pressure signal coming from the pressure sensor 5, as well as of other signals coming from sensors placed in the power-train system.

As already cited, the ECU 9 may receive in input, in addition to the common-rail pressure signal coming from sensor 5, the electric current feedback coming from both the metering valve unit 4 and the injectors 7, an engine rotary speed signal co coming from a proper detector (not shown), as well as a battery voltage signal $V_{batt}$, monitored (digitized) in the ECU 9 (or upstream to said ECU 9).

In particular, as to the metering valve unit 4, operation control, ECU 9, at least on the basis of the aforesaid input signals, is capable to send PWM output signals, with a suitable duty cycle, to the metering valve unit 4, thus regulating the fuel quantity provided by the high pressure pump 3 to the common rail 6.

As described above, the electronic digital control unit 9 that is able to PWM (Pulse Width Modulation) regulate the metering valve unit 4 of a common rail in a diesel power-train system can be subjected to aliasing effect on the battery voltage signal monitored by the same control unit 9. In fact, such a ECU 9, as known in the art, preferably is a closed loop control unit comprising a controller module, with a main transfer function R(S), that receives in input at least the battery voltage signal $V_{batt}$ with the desired current $I^*_{MU}$, corresponding to the common rail requested fuel quantity Q*, and provides as a output a pulse width modulation (PWM) of a duty-cycle D* (or simply PWM duty-cycle D*) of the desired current $I^*_{MU}$, that is sent to the metering valve unit 4, in order to properly operate it.

It should be mentioned that the terms "controller module" have herein the meaning of any software and/or hardware means that, within an electronic digital control unit 9, are capable of controlling a relevant actuator, such as the aforesaid metering valve unit 4 of the high pressure pump 3. As already seen, it has been ascertained that the actual battery voltage signal $V_{batt}$ monitored in the control unit 9 is affected by a periodic ripple superimposed to its voltage mean value, such a way the first harmonic frequency of the battery voltage signal $V_{batt}$ is a direct function of the engine rotary speed ω.

Such a periodic ripple is mainly due to battery drops and to noises conducted through the lines of the electrical circuit of the power-train system, or irradiated therein. Moreover, since it should be clear that driving of the actuators in a diesel common-rail power-train system is generally synchronous with the engine position, and hence to its rotary speed, battery drops and noises in the control unit 9 follow such synchronicity, in this way generating the ripple having a periodicity that depends on the engine rotary speed ω (or "rpm", when expressed in revolutions per minute).

In view of above, it should be clear that when the sampling time $t_s$ of the battery voltage monitoring means improperly match the battery voltage signal harmonic spectrum, an aliasing effect on battery voltage (digitalized) signal occurs. As already reported, assuming that the periodic component of the battery voltage signal is the following low frequency component:

$$f_{aliasing} = \left|\frac{1}{t_s} - \frac{\text{rpm}}{k \cdot 60}\right|$$

Where:

$$k = \frac{2}{\text{Cylinder number}}$$

Therefore when:

$$t_s \cong \frac{k \cdot 60}{\text{rpm}},$$

an additional low frequency component will be generated by aliasing effect, so that the digitalized (monitored) battery voltage signal will be affected by an equivalent harmonic spectrum ("alias") not corresponding to the real battery voltage signal.

Such an aliasing effect, as described above, when affecting the controller module for regulating said metering valve unit 4 in a diesel common-rail power-train system by means of a voltage Pulse Width Modulation technique, leads to a mismatch between the actual battery voltage signal $V_{batt}$ and the ideal (theoretical) battery voltage signal $\tilde{V}_{batt}$ that results in a noise oscillation $\Delta V_{MU}$ of the voltage $V_{MU}$ across the electromagnet of the metering valve unit.

Such a noise oscillation, using the small signal approximation, can be seen as:

$$\Delta V_{MU} = V_{MU} - V_{MU}^* = \frac{V_{MU}^*}{V_{batt}} \cdot \Delta V_{aliasing}$$

where: $-V^*_{MU}$ is the desired mean value of the voltage across the electromagnet of the metering valve unit; $-V_{batt}$: is the actual battery voltage signal; and $-\Delta V_{aliasing}$: is the noise oscillation of the battery voltage signal that is due to aliasing.

Figure 2:
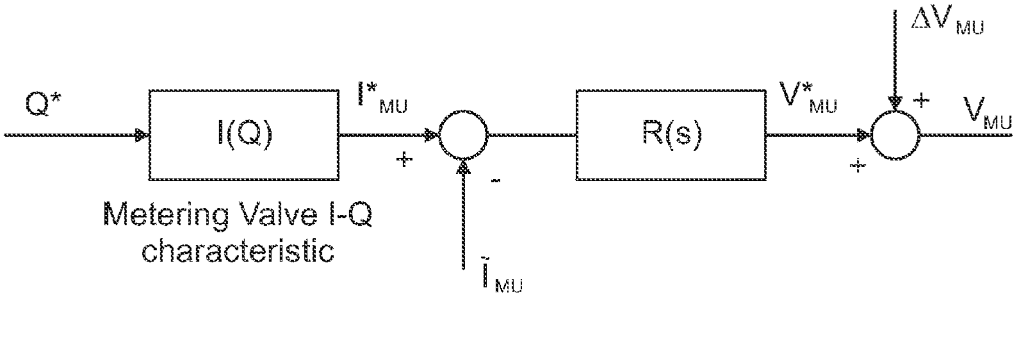
FIG. 2 is a simplified scheme of a closed loop control unit for regulating the metering valve unit in a diesel common-rail power-train system, according to the small signal approximation.
Figure 3:
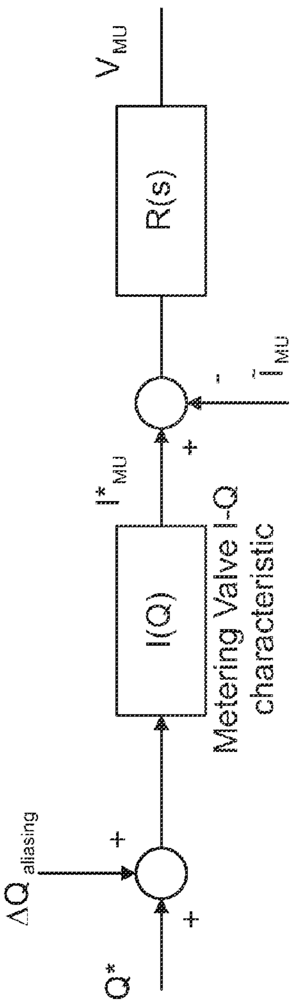
FIG. 3 is a different scheme of the closed loop control unit shown in FIG. 1.

As already discussed, considering now the system schemes of FIG. 1 and FIG. 2, approximately representing the control unit for PWM regulating the metering valve unit of a diesel common-rail power-train system, it should be evident that said noise oscillation $\Delta V_{MU}$ of the voltage $V_{MU}$ across the electromagnet of the metering valve unit, due to the aforesaid aliasing effect on the battery voltage signal, strongly affect the operation of the metering valve unit $\Delta Q_{aliasing}$ that is the equivalent fuel quantity oscillation due to the noise oscillation $\Delta V_{MU}$ of the voltage $V_{MU}$ across the electromagnet of the metering valve unit:

$$\Delta Q_{aliasing} = Q\left(\frac{\Delta V_{MU}}{R(s)}\right)$$

Where:

Q(I) is the characteristic curve of the metering valve unit, and −R(s) is the main transfer function of the controller module for regulating said metering valve unit) could reach values up to ~20÷40 $mm^3$/stroke, resulting in a pressure oscillation on the common rail 6 with a peak to peak magnitude up to 15÷30 MPa.

Figure 6:
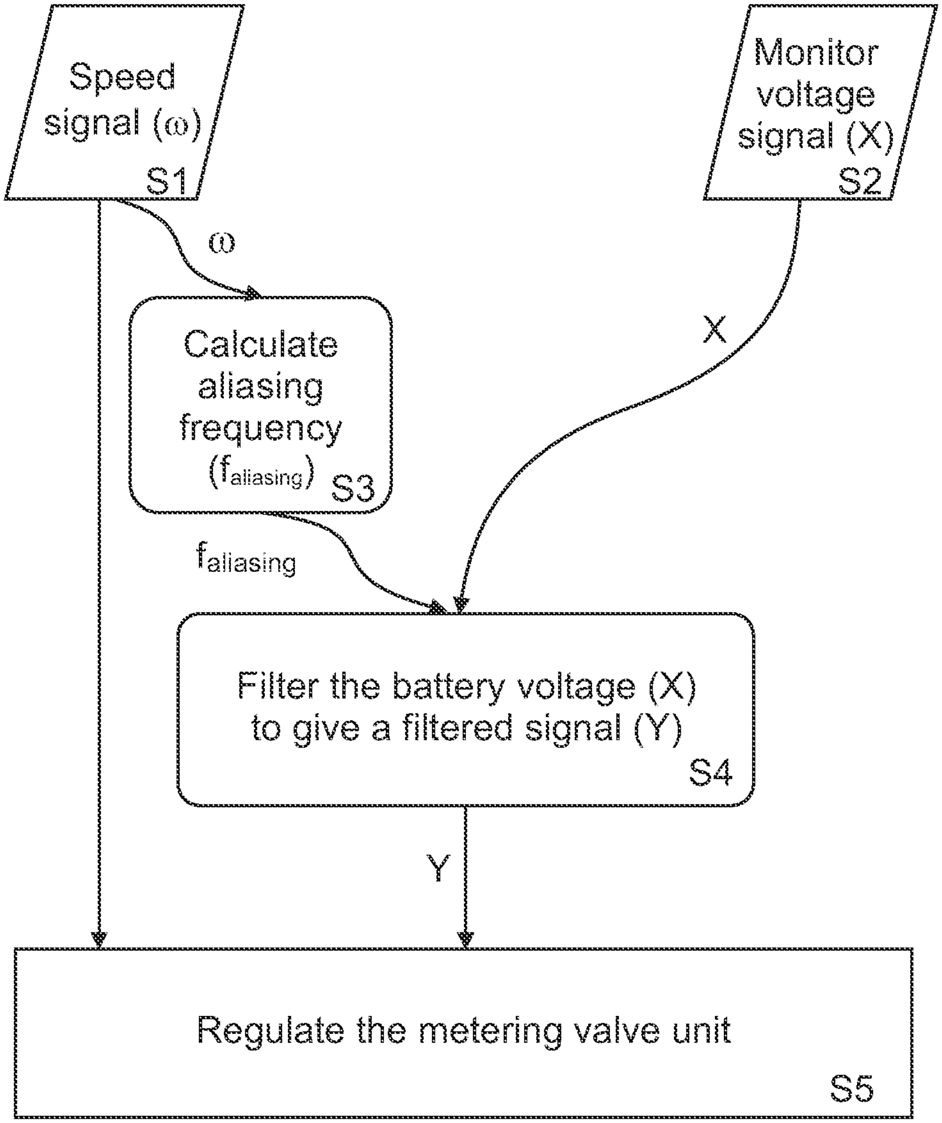
FIG. 6 is a schematic block diagram of the method according to an embodiment.

According to an embodiment, with reference also to FIG. 6, the method to minimize common rail pressure irregularities due to the aforesaid aliasing effect on the battery voltage signal provides that: the engine rotary speed signal ω is detected (block S1 in FIG. 6); the actual battery voltage $V_{batt}$ is monitored and the relevant digitized battery voltage signal X is acquired (block S2 in FIG. 6); the aliasing frequency $f_{aliasing}$ is calculated, on the basis of the engine rotary speed ω (also expressed in rpm) detected (block S3), and a highly selective digital non-linear filter is applied to the battery voltage signal X, corresponding to the monitored—digitized—real battery voltage $V_{batt}$, the digital non-linear filter, for small signal variations behaving as a notch filter that is centered on the first harmonic aliasing frequency (block S4).

The filtered battery voltage signal Y is then sent, with at least the engine rotary speed signal ω, to the controller module within the ECU 9 that is responsible to PWM regulating the metering valve unit 4 of the high pressure pump 3 feeding the common rail 6 (block S5 in FIG. 6). In this way, the non-linear digital filter according to an embodiment can substantially reject the low frequency component of the battery voltage signal that causes the aforesaid aliasing effect leading to undesired oscillations in the operation of the metering valve unit.

According to an embodiment, the non-linear notch filter is so designed that its parameters are calculated from the engine rotary speed co. Thus the digital non-linear notch filter, according to an embodiment, may have the following transfer function, in Z form (Z-Transform):

$$\frac{Y}{X} = \frac{n_2 Z^{-2} + n_1 Z^{-1} + n_0}{d_2 Z^{-2} + d_1 Z^{-1} + 1}$$

Where the parameters are calculated as a function of said aliasing frequency ($f_{aliasing}$), engine rotary speed signal co, computational refresh time T, and calibration parameters α and β:

$$\lambda_a = 2\pi \cdot f_{aliasing} \cdot T$$

$$n_2 = \frac{1}{\lambda_a^2 + \beta\lambda_a + 1}$$

$$n_1 = -\frac{\alpha\lambda_a + 2}{\lambda_a^2 + \beta\lambda_a + 1}$$

$$n_0 = \frac{\lambda_a^2 + \alpha\lambda_a + 1}{\lambda_a^2 + \beta\lambda_a + 1}$$

$$d_2 = \frac{1}{\lambda_a^2 + \beta\lambda_a + 1}$$

$$d_1 = -\frac{\beta\lambda_a + 2}{\lambda_a^2 + \beta\lambda_a + 1}$$

Preferably, as already discussed, said aliasing frequency ($f_{aliasing}$) is calculated according to the following formula:

$$f_{aliasing} = \left\|\frac{1}{t_s} - \frac{\text{rpm}}{\text{k} \cdot 60}\right\|$$

Where $t_s$ is the sampling time (of the battery voltage monitoring means) and rpm is the engine rotational speed (co) expressed as revolutions per minute. It should be noticed that α and β define a filter shape and they are calibrated so as to minimize the first harmonic generated by the aliasing effect, with a limited filtering bandwidth (for example only, α may be equal to 10 and β may be equal to 100).

Figure 4:
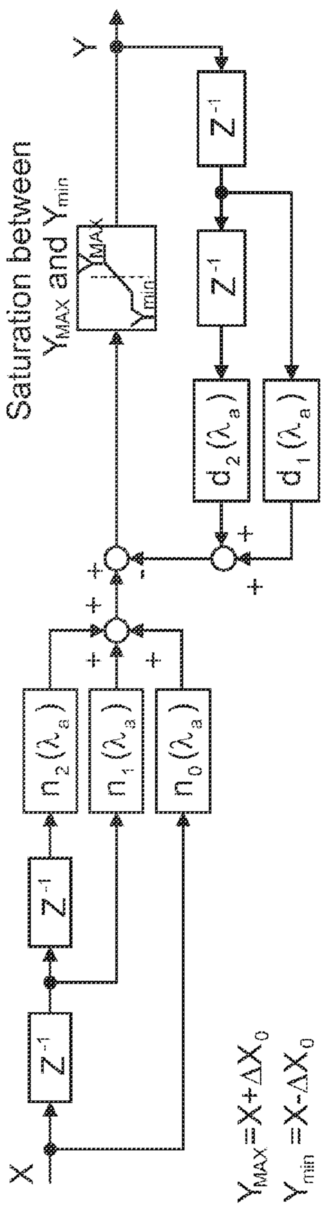
FIG. 4 is a functional scheme of a digital non-linear notch filter according to an embodiment.

In order to avoid time delay during strong transients, i.e., large actual signal variations, of the battery voltage (e.g., during engine cranking phases), the notch filter should be realized according to the implementation scheme reported in FIG. 4, which assures an immediate response when large signal variations in the battery voltage signal occur.

As can be seen, the digital non-linear notch filter represented in FIG. 4 comprises a dynamic saturation to its output Y, that forces the notch filter output Y to follow the input battery voltage signal X, when the absolute value $|Y-X|$ of the difference between the notch filter output Y and the battery voltage signal X exceeds a parameter $\Delta X_0$ that is set, after calibration, to be strictly higher than the battery voltage ripple magnitude responsible of the aliasing effect. Such a parameter $\Delta X_0$ is experimentally determined in order to make the filter properly following real strong battery voltage transients.

Even if the application of the afore-described digital non-linear notch filter, preferably with saturation on its input Y, leads to very good results as to the rejection of the aliasing effect on the battery voltage monitoring, i.e., it allows to input to the controller module of the control unit for PWM regulation of the metering valve unit 4 a battery voltage signal that is substantially devoid of certain low frequencies possibly resulting in some aliasing effect, it should be noticed that such a non-linear notch filter sometimes can cancel harmonic components of the input signal that are actually present in the battery voltage signal and that are correctly detected by the battery voltage monitoring means.

Therefore, a risk is present to cause an unduly excitation of the metering valve unit sensitivity since an insufficient match of the actual battery voltage with its filtered digital signal may occur, as a consequence of the activity of the aforesaid non-linear notch filter. Such a possible unduly mismatch between the actual battery voltage and its monitored signal results as an additional noise, that is similar to the aliasing noises discussed above.

In order to avoid, or limit, the unduly excitation of the metering valve unit sensitivity, the method according to a preferred embodiment of the present invention preferably provides that an additional transfer function F(Z) can be added in parallel to the main transfer function R(S) of the controller module. The additional transfer function F(Z) is defined with the following constraints: avoid to reduce bandwidth; and get high gain at low frequency, such a way the rejection of said additional noise I maximized.

Figure 5:
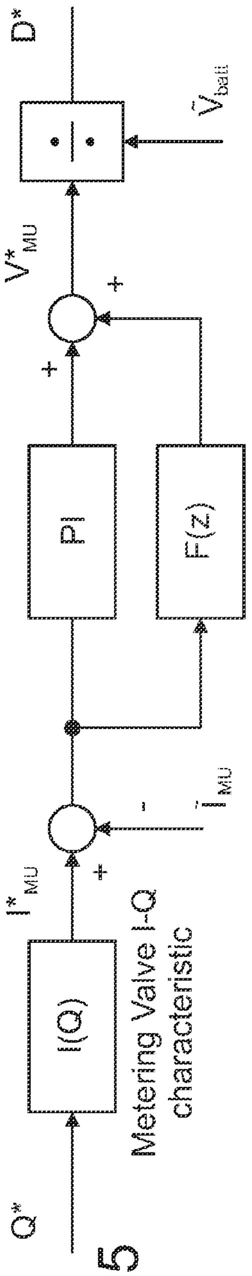
FIG. 5 is a scheme of a closed loop control unit for regulating the metering valve unit in a diesel common-rail power-train system, in which the controller module for regulating the metering valve unit comprises an additional transfer function, according to an embodiment.

With reference now to FIG. 5, in case said controller module includes a closed control loop with a PI (Proportional Integrative) regulator, then said additional transfer function F(Z), in Z form, may be preferably defined as:

$$F(Z) = \frac{K_0}{a_2 Z^{-2} + a_1 Z^{-1} + a_0}$$

Where $K_0$ is the gain and $a_2$, $a_1$ and $a_0$ are parameters depending on $\omega_0$ and T, and are calculated as follows:

$$a_0 = \frac{2(\omega_0 T)^2 + 2(\omega_0 T) + 1}{2(\omega_0 T)^2}$$

$$a_1 = -\frac{(\omega_0 T) + 1}{(\omega_0 T)^2}$$

$$a_2 = \frac{1}{2(\omega_0 T)^2}$$

The use of such an additional transfer function, that introduces a high gain $K_0$ at frequencies lower than $\omega_0/2\pi$, in parallel to the main transfer function, helps to avoid that actual low frequencies of the battery voltage signal are unduly cut. Note that $\omega_0$ is a proper angular frequency at which two poles of the additional transfer function are present, and T is the digital calculation refresh time.

According to another embodiment, a computer program comprising computer executable codes for PWM regulations of a metering valve unit in a diesel common-rail power-train system, wherein at least an engine rotary speed signal ($\omega$) is detected and at least a battery voltage signal (X) is monitored and input to a controller module for PWM regulating said metering valve unit, is provided.

Such a computer program is stored on a computer-readable medium, or on a suitable storage unit, and comprises: computer executable code for calculating the aliasing frequency ($f_{aliasing}$) on the monitored battery voltage signal (X), as a function of the detected rotary speed signal ($\omega$); a computer executable code for implementing at least one digital non-linear notch filter, that is centered on the first harmonic of said aliasing frequency ($f_{aliasing}$); and a computer executable code for filtering said battery voltage signal (X) before it is input to the aforesaid controller module by means of the digital non-linear notch filter.

According to an embodiment, the computer program also comprises computer executable code for calculating the parameters of the digital non-linear notch filter at least on the basis of the engine rotary speed signal ($\omega$). In a preferred embodiment, the computer executable code for implementing the digital non-linear notch filter comprises computer executable code for implementing a dynamic saturation to the output (Y) of the digital non-linear notch filter.

As already said, said dynamic saturation preferably forces the notch filter output (Y) to follow the battery voltage signal (X), when the absolute value $|Y-X|$ of the difference between the notch filter output (Y) and the battery voltage signal (X) exceeds a parameter $\Delta X_0$ that is set, after calibration, to be strictly higher than the battery voltage ripple magnitude responsible of the aliasing effect. Such a parameter $\Delta X_0$ is experimentally determined in order to make the filter properly following real strong battery voltage transients.

The computer program described above may also comprise a computer executable code for implementing the aforesaid at least one digital non-linear notch filter with the following transfer function in Z form:

$$\frac{Y}{X} = \frac{n_2 Z^{-2} + n_1 Z^{-1} + n_0}{d_2 Z^{-2} + d_1 Z^{-1} + 1}$$

where the parameters are calculated as a function of the aliasing frequency ($f_{aliasing}$), the engine rotary speed signal ($\omega$), the computational refresh time T, and some calibration parameters $\alpha$ and $\beta$:

$$\lambda_a = 2\pi \cdot f_{aliasing} \cdot T$$

$$n_2 = \frac{1}{\lambda_a^2 + \beta\lambda_a + 1}$$

$$n_1 = -\frac{\alpha\lambda_a + 2}{\lambda_a^2 + \beta\lambda_a + 1}$$

$$n_0 = \frac{\lambda_a^2 + \alpha\lambda_a + 1}{\lambda_a^2 + \beta\lambda_a + 1}$$

-continued $$d_2 = \frac{1}{\lambda_a^2 + \beta\lambda_a + 1}$$

$$d_1 = -\frac{\beta\lambda_a + 2}{\lambda_a^2 + \beta\lambda_a + 1}$$

where said parameters $\alpha$ and $\beta$ define the filter shape and they are calibrated so as to minimize the first harmonic generated by the aliasing effect, with a limited filtering bandwidth (for example only, $\alpha$ may be equal to 10 and $\beta$ may be equal to 100).

Preferably, the computer program according to a particular embodiment of the invention, comprises a computer executable code for calculating the alias ing frequency ($f_{aliasing}$) according to the following formula:

$$f_{aliasing} = \left\| \frac{1}{t_s} - \frac{\text{rpm}}{\text{k} \cdot 60} \right\|$$

Where $t_s$ is the sampling time; rpm: is the engine rotational speed ($\omega$) expressed as revolutions per minute, k: is a constant depending on the cylinder number of the engine $$\left(k = \frac{2}{\text{cylinder number}}\right).$$

According to another embodiment, the computer program further comprises a computer executable code for implementing the controller module for PWM regulating the metering valve unit of a diesel common-rail power-train system with a main transfer function, and further comprises a computer executable code for introducing an additional transfer function F(Z) in parallel to said main transfer function of the controller module. The additional transfer function has at least the constraints of avoiding reducing bandwidth and, at the same time, of obtaining high gain $K_0$ at low frequency. Where the main transfer function of the controller module should preferably be a PI transfer function, the computer program according to an embodiment of the present invention comprises a computer executable code for implementing the controller module for PWM regulating the metering valve unit of a diesel common-rail power-train system with a closed control loop having a PI (Proportional Integrative) main transfer function, as well as it comprises a computer executable code for implementing said additional transfer function, in Z form, as:

$$F(Z) = \frac{K_0}{a_2 Z^{-2} + a_1 Z^{-1} + a_0}$$

Where $K_0$ is the gain and $a_2$, $a_1$ and $a_0$ are parameters depending on $\omega_0$ and T, and are calculated as follows:

$$a_0 = \frac{2(\omega_0 T)^2 + 2(\omega_0 T) + 1}{2(\omega_0 T)^2}$$

$$a_1 = -\frac{(\omega_0 T) + 1}{(\omega_0 T)^2}$$

-continued $$a_2 = \frac{1}{2(\omega_0 T)^2}$$

where T is the computational refresh time and $\omega_0$ is the angular frequency at which two poles of said additional transfer function F(Z) lie.

According to an embodiment, it is provided a controller module in an electronic control unit 9 for PWM regulating a metering valve unit 4 in a diesel common-rail 6 power-train system that includes a microprocessor and a storage memory for storing a computer program, according to the description above, which comprises computer executable codes for driving a metering valve unit 4 of the high pressure pump 3 of a common-rail 6 in a diesel common-rail power-train system. The microprocessor is able to receive and to execute the aforesaid computer executable codes of the above-described computer program.

Figure 7:
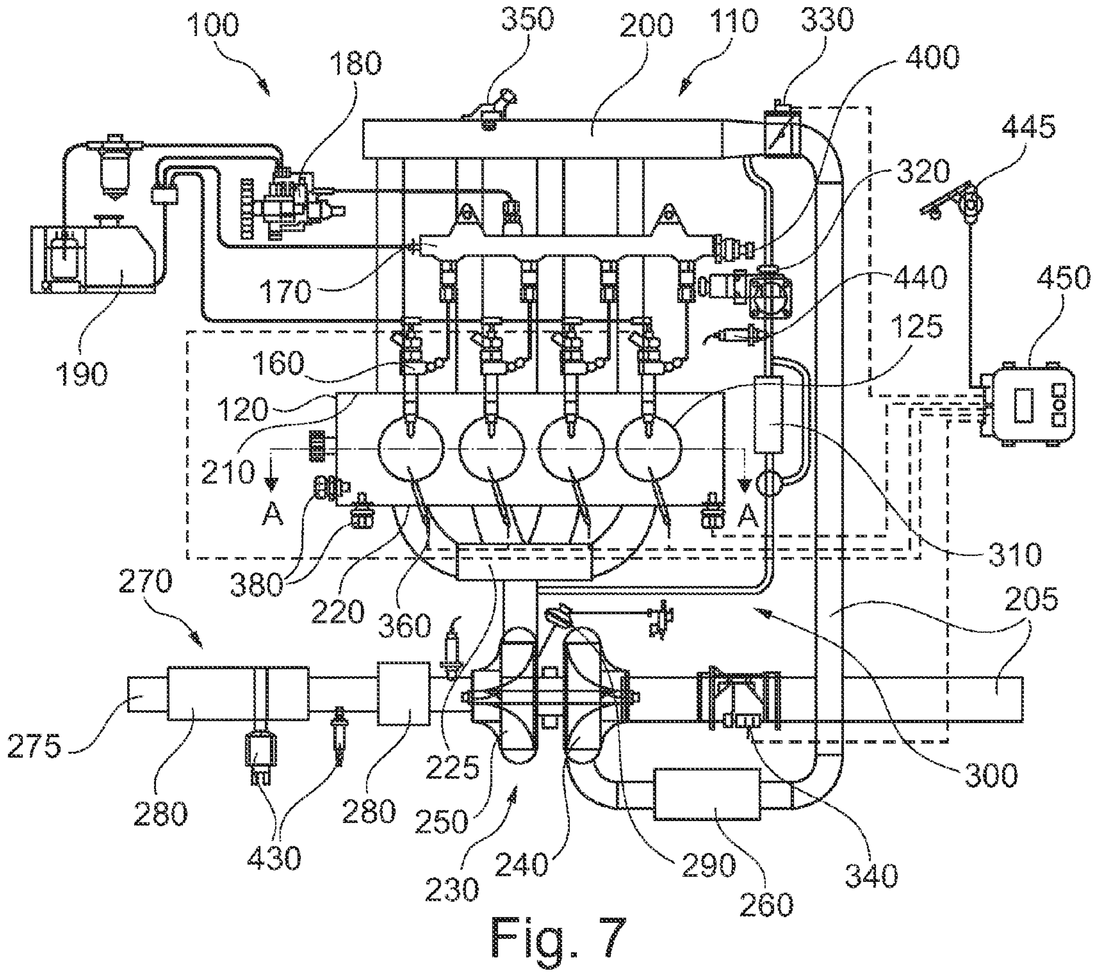
FIG. 7 and FIG. 8 are schematic views of an automotive system to which some embodiments may apply.
Figure 8:
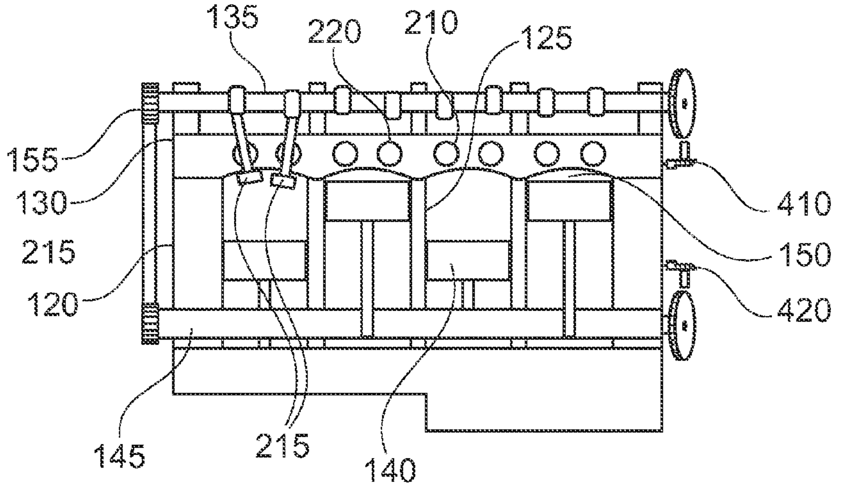

According to an embodiment, it is provided a computer program product including a readable medium in which a computer program according to the description above is stored. Some embodiments may include an automotive system 100, as shown in FIG. 7 and FIG. 8, that includes an internal combustion engine (ICE) 110 having an engine block 120 defining at least one cylinder 125 having a piston 140 coupled to rotate a crankshaft 145. A cylinder head 130 cooperates with the piston 140 to define a combustion chamber 150. A fuel and air mixture (not shown) is disposed in the combustion chamber 150 and ignited, resulting in hot expanding exhaust gasses causing reciprocal movement of the piston 140. The fuel is provided by at least one fuel injector 160 and the air through at least one intake port 210. The fuel is provided at high pressure to the fuel injector 160 from a fuel rail 170 in fluid communication with a high pressure fuel pump 180 that increase the pressure of the fuel received a fuel source 190. Each of the cylinders 125 has at least two valves 215, actuated by a camshaft 135 rotating in time with the crankshaft 145. The valves 215 selectively allow air into the combustion chamber 150 from the port 210 and alternately allow exhaust gases to exit through a port 220. In some examples, a cam phaser 155 may selectively vary the timing between the camshaft 135 and the crankshaft 145.

The air may be distributed to the air intake port(s) 210 through an intake manifold 200. An air intake duct 205 may provide air from the ambient environment to the intake manifold 200. In other embodiments, a throttle body 330 may be provided to regulate the flow of air into the manifold 200. In still other embodiments, a forced air system such as a turbocharger 230, having a compressor 240 rotationally coupled to a turbine 250, may be provided. Rotation of the compressor 240 increases the pressure and temperature of the air in the duct 205 and manifold 200. An intercooler 260 disposed in the duct 205 may reduce the temperature of the air. The turbine 250 rotates by receiving exhaust gases from an exhaust manifold 225 that directs exhaust gases from the exhaust ports 220 and through a series of vanes prior to expansion through the turbine 250. The exhaust gases exit the turbine 250 and are directed into an exhaust system 270. This example shows a variable geometry turbine (VGT) with a VGT actuator 290 arranged to move the vanes to alter the flow of the exhaust gases through the turbine 250. In other embodiments, the turbocharger 230 may be fixed geometry and/or include a waste gate.

The exhaust system 270 may include an exhaust pipe 275 having one or more exhaust after-treatment devices 280. The after-treatment devices may be any device configured to change the composition of the exhaust gases. Some examples of after-treatment devices 280 include, but are not limited to, catalytic converters (two and three way), oxidation catalysts, lean NOx traps, hydrocarbon absorbers, selective catalytic reduction (SCR) systems, and particulate filters. Other embodiments may include an exhaust gas recirculation (EGR) system 300 coupled between the exhaust manifold 225 and the intake manifold 200. The EGR system 300 may include an EGR cooler 310 to reduce the temperature of the exhaust gases in the EGR system 300. An EGR valve 320 regulates a flow of exhaust gases in the EGR system 300.

The automotive system 100 may further include an electronic control unit (ECU) 450 in communication with one or more sensors and/or devices associated with the ICE 110. The ECU 450 may receive input signals from various sensors configured to generate the signals in proportion to various physical parameters associated with the ICE 110. The sensors include, but are not limited to, a mass airflow and temperature sensor 340, a manifold pressure and temperature sensor 350, a combustion pressure sensor 360, coolant and oil temperature and level sensors 380, a fuel rail pressure sensor 400, a cam position sensor 410, a crank position sensor 420, exhaust pressure and temperature sensors 430, an EGR temperature sensor 440, and an accelerator pedal position sensor 445. Furthermore, the ECU 450 may generate output signals to various control devices that are arranged to control the operation of the ICE 110, including, but not limited to, the fuel injectors 160, the throttle body 330, the EGR Valve 320, the VGT actuator 290, and the cam phaser 155. Note, dashed lines are used to indicate communication between the ECU 450 and the various sensors and devices, but some are omitted for clarity.

Turning now to the ECU 450, this apparatus may include a digital central processing unit (CPU) in communication with a memory system and an interface bus. The CPU is configured to execute instructions stored as a program in the memory system, and send and receive signals to/from the interface bus. The memory system may include various storage types including optical storage, magnetic storage, solid state storage, and other non-volatile memory. The interface bus may be configured to send, receive, and modulate analog and/or digital signals to/from the various sensors and control devices. The program may embody the methods disclosed herein, allowing the CPU to carryout out the steps of such methods and control the ICE 110.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents.

What is claimed is:

1. A method to minimize common rail pressure irregularities due to aliasing effect on battery voltage monitoring in a digital electronic control unit that is capable of PWM (Pulse Width Modulation) regulations of a metering valve unit in a diesel common-rail power-train system, wherein at least an engine rotary speed signal is detected and at least a battery voltage signal is monitored and input to a controller module in said digital electronic control unit for PWM regulating said metering valve unit of said diesel common-rail power-train system, the method comprising:

calculating an aliasing frequency on said battery voltage signal as a function of said engine rotary speed signal;

filtering said battery voltage signal before it is input to said controller module with at least one digital non-linear notch filter, the at least one digital non-linear notch filter is centered about a first harmonic of said aliasing frequency; and inputting the battery voltage signal with at least the engine rotary speed signal to the controller module of the digital electronic control unit for PWM regulating said metering valve unit.

2. The method according to claim 1, further comprising calculating parameters of said at least one digital non-linear notch filter at least partially calculated on a basis of said engine rotary speed signal.

3. The method according to claim 1, wherein said filtering said battery voltage signal comprises providing a dynamic saturation to an output of said at least one digital non-linear notch filter, said dynamic saturation forcing a notch filter output Y to follow said battery voltage signal X when an absolute value |Y−X| of a difference between the notch filter output and the battery voltage signal exceeds a parameter $\Delta X_0$ that is experimentally set, after calibration, to be higher than a battery voltage ripple magnitude that is responsible of the aliasing effect.

4. The method according to claim 1, wherein said at least one digital non-linear notch filter is implemented with a transfer function in Z form of:

$$\frac{Y}{X} = \frac{n_2 Z^{-2} + n_1 Z^{-1} + n_0}{d_2 Z^{-2} + d_1 Z^{-1} + 1}$$

where parameters are calculated as a function of said aliasing frequency, the engine rotary speed signal, a computational refresh time T, and calibration parameters α and β:

$$\lambda_a = 2\pi \cdot f_{aliasing} \cdot T$$

$$n_2 = \frac{1}{\lambda_a^2 + \beta\lambda_a + 1}$$

$$n_1 = -\frac{\alpha\lambda_a + 2}{\lambda_a^2 + \beta\lambda_a + 1}$$

$$n_0 = \frac{\lambda_a^2 + \alpha\lambda_a + 1}{\lambda_a^2 + \beta\lambda_a + 1}$$

$$d_2 = \frac{1}{\lambda_a^2 + \beta\lambda_a + 1}$$

$$d_1 = -\frac{\beta\lambda_a + 2}{\lambda_a^2 + \beta\lambda_a + 1},$$

wherein said parameters α and β define a filter shape and calibrated so as to minimize the first harmonic generated by the aliasing effect, with a limited filtering bandwidth.

5. The method according to claim 1, wherein said aliasing frequency is calculated according to:

$$f_{aliasing} = \left\| \frac{1}{t_s} - \frac{\text{rpm}}{\text{k} \cdot 60} \right\|$$

wherein $t_s$ is sampling time, rpm is an engine rotational speed expressed as revolutions per minute, k is a constant depending on a cylinder number $$k = \frac{2}{\text{Cylinder number}}.$$

6. A method according to claim 1, wherein said controller module for PWM regulating said metering valve unit of said diesel common-rail power-train system has a main transfer function, the method further comprising introducing an additional transfer function F(Z) in parallel to the main transfer function of said controller module, said additional transfer function having at least constraints of reducing bandwidth and, at the same time, obtaining high gain at low frequency.

7. A method according to claim 6, wherein said controller module comprises a closed control loop with a PI (Proportional Integrative) main transfer function and said additional transfer function, in Z form:

$$F(Z) = \frac{K_0}{a_2 Z^{-2} + a_1 Z^{-1} + a_0}$$

wherein $K_0$ is the gain and $a_2$, $a_1$ and $a_0$ are parameters depending on $\omega_0$ and T, and are calculated according to:

$$a_0 = \frac{2(\omega_0 T)^2 + 2(\omega_0 T) + 1}{2(\omega_0 T)^2}$$

$$a_1 = -\frac{(\omega_0 T) + 1}{(\omega_0 T)^2}$$

$$a_2 = \frac{1}{2(\omega_0 T)^2}$$

where T is a computational refresh time and $\omega_0$ is an angular frequency at which two poles of said additional transfer function F(Z) lie.

8. A non-transitory computer readable medium embodying a computer program product, said computer program product comprising:

a regulating program for regulating PWM (Pulse Width Modulation) regulations of a metering valve unit in a diesel common-rail power-train system, wherein at least an engine rotary speed signal is detected and at least a battery voltage signal is monitored and input to a controller module in a digital electronic control unit for PWM regulating said metering valve unit of said diesel common-rail power-train system, the regulating program configured to:

calculate an aliasing frequency on said battery voltage signal as a function of said engine rotary speed signal;

implement at least one digital non-linear notch filter that is centered about a first harmonic of said aliasing frequency;

filter said battery voltage signal before inputting to the controller module with the at least one digital non-linear notch filter.

9. The non-transitory computer readable medium embodying the computer program product according to claim 8, the regulating program further configured to calculate parameters of said at least one digital non-linear notch filter at least on a basis of said engine rotary speed signal.

10. The non-transitory computer readable medium embodying the computer program product according to claim 8, the regulating program further configured to implement a dynamic saturation to an output of said at least one digital non-linear notch filter, said dynamic saturation forcing a notch filter output Y to follow said battery voltage signal X, when an absolute value |Y−X| of a difference between the notch filter output and the battery voltage signal exceeds a parameter $\Delta X_0$ that is experimentally set, after calibration, to be strictly higher than a battery voltage ripple magnitude that is responsible of an aliasing effect.

11. The non-transitory computer readable medium embodying the computer program product according to claim 8, the regulating program further configured to implement said at least one digital non-linear notch filter with a transfer function in Z form of:

$$\frac{Y}{X} = \frac{n_2 Z^{-2} + n_1 Z^{-1} + n_0}{d_2 Z^{-2} + d_1 Z^{-1} + 1}$$

where parameters are calculated as a function of said aliasing frequency, the engine rotary speed signal, a computational refresh time T, and calibration parameters α and β:

$$\lambda_a = 2\pi \cdot f_{aliasing} \cdot T$$

$$n_2 = \frac{1}{\lambda_a^2 + \beta\lambda_a + 1}$$

$$n_1 = -\frac{\alpha\lambda_a + 2}{\lambda_a^2 + \beta\lambda_a + 1}$$

$$n_0 = \frac{\lambda_a^2 + \alpha\lambda_a + 1}{\lambda_a^2 + \beta\lambda_a + 1}$$

$$d_2 = \frac{1}{\lambda_a^2 + \beta\lambda_a + 1}$$

$$d_1 = -\frac{\beta\lambda_a + 2}{\lambda_a^2 + \beta\lambda_a + 1}$$

wherein said parameters α and β define a filter shape and they are calibrated so as to minimize the first harmonic generated by an aliasing effect, with a limited filtering bandwidth, wherein $f_{aliasing}$ is calculated according to:

$$f_{aliasing} = \left| \frac{1}{t_s} - \frac{\text{rpm}}{k \cdot 60} \right|$$

wherein $t_s$ is sampling time, rpm is an engine rotational speed expressed as revolutions per minute, k is a constant depending on a cylinder number $$k = \frac{2}{\text{Cylinder number}}.$$

12. The non-transitory computer readable medium embodying the computer program product according to claim 8, the regulating program further configured to:

implement said controller module for PWM regulating said metering valve unit of said diesel common-rail power-train system with a main transfer function; and introduce an additional transfer function in parallel to said main transfer function of said controller module, said additional transfer function having at least constraints of reducing bandwidth and, at the same time, obtaining high gain at low frequency.

13. The non-transitory computer readable medium embodying the computer program product according to claim 12, the regulating program further configured to:

implement said controller module for PWM regulating said metering valve unit of said diesel common-rail power-train system with a closed control loop having a PI (Proportional Integrative) regulator, and implement said additional transfer function in Z form, as:

$$F(Z) = \frac{K_0}{a_2 Z^{-2} + a_1 Z^{-1} + a_0}$$

wherein $K_0$ is the gain and $a_2$, $a_1$ and $a_0$ are parameters depending on $\omega_0$ and T, and are calculated as follows:

$$a_0 = \frac{2(\omega_0 T)^2 + 2(\omega_0 T) + 1}{2(\omega_0 T)^2}$$

$$a_1 = -\frac{(\omega_0 T) + 1}{(\omega_0 T)^2}$$

$$a_2 = \frac{1}{2(\omega_0 T)^2}$$

where T is a computational refresh time and ω0 is an angular frequency at which two poles of said additional transfer function F(Z) lie.

14. A controller module in a digital electronic control unit that is configured for PWM (Pulse Width Modulation) regulating a metering valve unit in a diesel common-rail power-train system, comprising:

a common-rail in the diesel common-rail power-train system;

a high pressure pump of the common-rail;

a metering unit of the high pressure pump of the common-rail; and a microprocessor that is configured to drive the metering unit of the high pressure pump of the common-rail in the diesel common-rail power-train system, said microprocessor configured to:

calculate an aliasing frequency on a battery voltage signal as a function of an engine rotary speed signal;

implement at least one digital non-linear notch filter, said at least one digital non-linear notch filter is centered about a first harmonic of the aliasing frequency;

filter said battery voltage signal before inputting to the controller module with said at least one digital non-linear notch filter.

15. The controller module according to claim 14, the microprocessor further configured to calculate parameters of said at least one digital non-linear notch filter at least on a basis of an engine rotary speed signal.

16. The controller module according to claim 14, the microprocessor further configured to implement a dynamic saturation to an output of said at least one digital non-linear notch filter, said dynamic saturation forcing a notch filter output Y to follow said battery voltage signal X, when an absolute value |Y−X| of a difference between the notch filter output and the battery voltage signal exceeds a parameter $\Delta X_0$ that is experimentally set, after calibration, to be strictly higher than a battery voltage ripple magnitude that is responsible of an aliasing effect.

17. The controller module according to claim 14, the microprocessor further configured to implement said at least one digital non-linear notch filter with a transfer function in Z form of:

$$\frac{Y}{X} = \frac{n_2 Z^{-2} + n_1 Z^{-1} + n_0}{d_2 Z^{-2} + d_1 Z^{-1} + 1}$$

where parameters are calculated as a function of said aliasing frequency, an engine rotary speed signal, a computational refresh time T, and calibration parameters α and β:

$$\lambda_a = 2\pi \cdot f_{aliasing} \cdot T$$

$$n_2 = \frac{1}{\lambda_a^2 + \beta\lambda_a + 1}$$

$$n_1 = -\frac{\alpha\lambda_a + 2}{\lambda_a^2 + \beta\lambda_a + 1}$$

$$n_0 = \frac{\lambda_a^2 + \alpha\lambda_a + 1}{\lambda_a^2 + \beta\lambda_a + 1}$$

$$d_2 = \frac{1}{\lambda_a^2 + \beta\lambda_a + 1}$$

$$d_1 = -\frac{\beta\lambda_a + 2}{\lambda_a^2 + \beta\lambda_a + 1}$$

wherein said parameters α and β define a filter shape and they are calibrated so as to minimize the first harmonic generated by an aliasing effect, with a limited filtering bandwidth, wherein $f_{aliasing}$ is calculated according to:

$$f_{aliasing} = \left| \frac{1}{t_s} - \frac{\text{rpm}}{k \cdot 60} \right|$$

wherein $t_s$ is sampling time, rpm is an engine rotational speed expressed as revolutions per minute, k is a constant depending on a cylinder number $$k = \frac{2}{\text{Cylinder number}}.$$

18. The controller module according to claim 14, the microprocessor configured to:

implement said controller module for PWM regulating said metering, valve unit of said diesel common-rail power-train system with a main transfer function; and introduce an additional transfer function in parallel to said main transfer function of said controller module, said additional transfer function having at least constraints of reducing bandwidth and, at the same time, obtaining high gain at low frequency.

19. The controller module according to claim 18, the microprocessor further configured to:

implement said controller module for PWM regulating said metering valve unit of said diesel common-rail power-train system with a closed control loop having a PI (Proportional Integrative) regulator, and implement said additional transfer function in Z form, as:

$$F(Z) = \frac{K_0}{a_2 Z^{-2} + a_1 Z^{-1} + a_0}$$

wherein $K_0$ is the gain and $a_2$, $a_1$ and $a_0$ are parameters depending on $\omega_0$ and T, and are calculated as follows:

$$a_0 = \frac{2(\omega_0 T)^2 + 2(\omega_0 T) + 1}{2(\omega_0 T)^2}$$

$$a_1 = -\frac{(\omega_0 T) + 1}{(\omega_0 T)^2}$$

$$a_2 = \frac{1}{2(\omega_0 T)^2}$$

where T is a computational refresh time and $\omega_0$ is an angular frequency at which two poles of said additional transfer function F(Z) lie.

* * * * *